US006621449B1

United States Patent
Kunert

(10) Patent No.: US 6,621,449 B1
(45) Date of Patent: Sep. 16, 2003

(54) METHOD FOR DETECTION AND CORRECTION OF NONLINEARITIES IN RADIO-FREQUENCY VOLTAGE CONTROLLED OSCILLATORS

(75) Inventor: Martin Kunert, Neutraubling (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/831,570

(22) PCT Filed: Nov. 11, 1999

(86) PCT No.: PCT/DE99/03595

§ 371 (c)(1),
(2), (4) Date: May 11, 2001

(87) PCT Pub. No.: WO00/28349

PCT Pub. Date: May 18, 2000

(30) Foreign Application Priority Data

Nov. 11, 1998 (DE) .......................... 198 52 017

(51) Int. Cl.[7] .................... G01S 13/00; G01S 7/40; G01S 13/08; H03C 3/06; H03C 3/09
(52) U.S. Cl. .................... 342/70; 342/174; 342/128; 342/124; 332/126
(58) Field of Search .................... 342/70, 124, 128, 342/174; 332/126

(56) References Cited

U.S. PATENT DOCUMENTS 4,849,715 A * 7/1989 Weinzierl .................... 331/10
5,694,132 A * 12/1997 Johnson .................... 342/128
5,719,580 A 2/1998 Core
5,799,534 A 9/1998 Van der Pol
5,839,096 A * 11/1998 Lyons et al. .................... 342/165
5,867,536 A * 2/1999 Lyons et al. .................... 332/126
6,107,957 A * 8/2000 Cramer et al. .................... 342/124

FOREIGN PATENT DOCUMENTS

| DE | 38 30 992 A1 | 3/1990 |
| EP | 0727 051 B1 | 8/1998 |
| WO | 98/37705 | 8/1998 |

OTHER PUBLICATIONS

"Novel Heterodyne 24 GHz FMCW Radar with High-Precision 2, 4GHz SAW Reference Path" in MIOP'97.

"A Low Cost mm-Wave Cruise Control System for Automotive Applications" in Microwave Journal, Oct. 1993.

* cited by examiner

Primary Examiner—Thomas H. Tarcza
Assistant Examiner—Brian Andrea
(74) Attorney, Agent, or Firm—Morrison & Foerster LLP

(57) ABSTRACT

A method for detection and correction of nonlinearities in radio-frequency voltage controlled oscillators provides for division of the output signal of the oscillator, direct analysis of the divided output signal by means of a counting device, conversion of the respective counter value to an equivalent voltage value, and production of a control signal with a corrected frequency response for the oscillator by logic-link the equivalent-voltage value to a predetermined nominal value.

2 Claims, 5 Drawing Sheets

METHOD FOR DETECTION AND CORRECTION OF NONLINEARITIES IN RADIO-FREQUENCY VOLTAGE CONTROLLED OSCILLATORS

This application claims priority to International Application No. PCT/DE99/03595 which was published in the German language on May 18, 2000.

TECHNICAL FIELD OF THE INVENTION

The invention relates to a method for detection and correction of nonlinearities in radio-frequency voltage controlled oscillators, and in particular, to a method for detection and correction of nonlinearities in radio-frequency voltage controlled oscillators such as those which are used in the form of microwave oscillators for radar applications in motor vehicles.

BACKGROUND OF THE INVENTION

Radar technology is particularly suitable for use in rugged environments in motor vehicles or in industry for the purpose of contactless detection of the distance, speed, condition presence or the like of objects. The functionality, measurement accuracy and costs of radar sensors in this case depend essentially on the modulation method used, and on the associated radar signal processing.

With the FMCW (frequency modulated continuous wave) radar principle which is frequently used for distance measurement, the quality of the measured value depends on the frequency accuracy and stability of the microwave oscillator. In practice, these variables are influenced in particular by temperature drift, noise and nonlinearities in the oscillator, and therefore, generally need to be monitored.

Contactless distance and speed measurement by radar has been known for a long time, and originates from military technology. EP 0 727 051 B1 describes a conventional FMCW method for operation of a radar works, a frequency-modulated radar signal is transmitted and is received with a phase and/or frequency shift. The measured phase and/or frequency difference, which is typically in the kHz range, is proportional to the object distance, provided the frequency modulation is carried out linearly with time. In practice, this precondition is often satisfied only inadequately.

The nonlinearities in frequency modulation are primarily caused by the voltage controlled oscillators, since, by virtue of the components used, they have a non linear voltage/frequency characteristic. Furthermore, these oscillators have phase noise which is pronounced to a greater or lesser extent and whose frequency is considerably higher than the voltage-dependent non linearity and it can generally be ignored for short distances—the so-called correlation length of the radar.

On the other hand, compensation for the voltage-dependent nonlinearities is absolutely essential in order to allow correct object detection to be carried out using the radar device. Since the nonlinearities vary, for example due to temperature or aging effects, any correction needs to be continuously adapted in order to keep the linearity errors within a maximum tolerance band of 1% of the measured value.

Appropriate correction methods are known from the prior art:

The oscillator can be actuated using a control voltage which is predetermined once and is subjected to pre-emphasis. However, the suitability of this method is limited since the concept does not compensate for differences between individual oscillators or for subsequent frequency fluctuations and a temperature drift.

The document WO 98/37705 discloses a dynamic self-adjusting synchronization system for a voltage controlled oscillator, in which the output signal of the oscillator is divided to a target frequency band whose frequency is lower than that of the oscillator output signal. Frequency counter values are accumulated by a counting device during a gate time which can be selected, in such a manner that a maximum counter value is reached at the maximum frequency of the oscillator output signal. The respective counter value is converted to an equivalent-voltage value by means of a microprocessor. Finally, a control circuit produces a control signal with a corrected frequency response for the oscillator, by logic-linking the equivalent-voltage value to a predetermined nominal value.

For level measurement using radar technology, the document U.S. Pat. No. 5,799,534 discloses a method in which the output signal of a voltage controlled oscillator is likewise divided down to a target frequency band, whose frequency is lower than that of the oscillator output signal. Frequency counter values are detected by means of a counting device. These counter values are then converted to an equivalent-voltage value. A control signal with a corrected frequency response for the oscillator is produced as a function of this value.

The specialist article by P. Lowbridge et al. "A low Cost mm-Wave Cruise Control System for Automotive Applications" in Microwave Journal, October 1993 describes the use of a control loop which comprises a PLL-(=Phase Lock Loop) or AFC (=Automatic Frequency Control) circuit. In both methods, a frequency-dependent reference voltage is produced and, in combination with a linear ramp, adapts the actuation voltage of the oscillator such that the frequency modulation profile, is linear with respect to time. However, such control electronics have the disadvantage of being too expensive and inflexible.

The specialist publication by Nalezinski et al. "Novel Heterodyne 24 GHz FMCW Radar with High-Precision 2.4 GHz SAW Reference Path" in the MIOP' 97 Conference Proceedings describes the use of a reference path within the radar arrangement, which, on the basis of its defined and precisely known delay time, corresponds to the reference signal, free of any disturbance variables, from a virtual reflection point whose distance is established by means of a nominal delay time. Actual signals with similar delay times can be corrected by analysis and evaluation of this signal. However, this method is subject to the disadvantage that the additional reference path and the evaluation unit associated with it are complex, and thus costly, to operate. The latter is unacceptable, particularly in the context of such radar sensors being used as mass-produced components in motor vehicles.

SUMMARY OF THE INVENTION

In one embodiment of the invention, there is a method for detection and correction of nonlinearities in radio-frequency voltage controlled oscillators. The method includes, for example, actuating the oscillators with a linear control voltage, dividing an output signal of the oscillator by an initial division factor by a frequency divider to a target frequency band which is at least one order of magnitude lower than that oscillator output signal, analyzing the divided output signal by a counting device with registers of the counting device being loaded with preset counts, which correspond to a linear frequency response of the output signal, and with the registers being counted down successively on the basis of the analyzed, actual profile of the divided output signal and signal sampling from a received signal being carried out when the value 0 is reached in the register.

In one aspect of the invention, the signal sampling from the received signal is initiated by triggering a sample-and-hold element inhuman analogue/digital converter by the counting device.

In another aspect of the invention, the analysis of the divided signal is carried out by detecting the count of the counting device in a gate time which can be selected, with the gate time being selected in advance such that a maximum counter value is reached at a maximum frequency of the oscillator output signal and a given initial division factor.

In still another aspect of the invention, the counter value is converted to an equivalent-voltage value using a digital/analogue converter.

In yet another aspect of the invention, successive detection of the period duration of the frequency flanks of the divided signal is carried out during the analysis of the divided signal.

In another aspect of the invention, the analysis is carried out by counting the flanks of the divided signal during a given gate time.

In yet another aspect of the invention, with the aid of a microcontroller, a linear-modulated control voltage for the oscillator is output via a pulse width modulation output of a microcontroller, a frequency error from an optimum linear frequency variation is determined for the oscillator on the basis of the analysis of the divided output signal, correction values are determined for a pulse width modulation output of the microcontroller, and a control voltage with a corrected frequency response for the oscillator is output via the pulse width modulation output PWM.

In still another aspect of the invention, the divided signal is cyclically monitored for linearity errors and, if necessary, correction of the control voltage with a corrected frequency response which is output at the pulse width modulation output.

In another embodiment of the invention, there is a method for detection and correction of nonlinearities in radio-frequency voltage controlled oscillators. The method includes, for example, actuating the oscillators using a linear control voltage, dividing an output signal of the oscillator by an initial division factor by a frequency divider to a target frequency band which is at least one order of magnitude less than the oscillator output signal; and analyzing the divided output signal by a counting device with registers of the counting device being loaded with preset counts, which correspond to a linear frequency response of the output signal, and with the registers being counted down successively on the basis of the analyzed, actual profile of the divided output signal and signal sampling from a received signal being carried out when the value 0 is reached in the register.

In another aspect of the invention, the signal sampling from the received signal is initiated by triggering a sample-and-hold element in an analogue/digital converter by the counting device.

DETAILED DESCRIPTION OF THE INVENTION

The invention specifies a method for detection and correction of nonlinearities in radio-frequency voltage controlled oscillators, which is extremely simple and can thus be implemented cost-effectively in a high-performance radar sensor.

The invention in this case is, in contrast to the method used in the prior art, to establish the timer profile of the output signal of the oscillator without a frequence signal, by direct measurement. The latter is simplified by division of the output signal of the oscillator by an initial division factor. The latter is preferably chosen such that the target frequency band lies in a frequency band which can be processed by standard logic modules. A counting device, for example a digital counter, is used to analyze directly the divided output signal, as a result of which corresponding counter values are detected. The latter are converted to an equivalent-voltage value which, by logic-linking to a predetermined nominal value, is used to produce a control signal with a corrected frequency response for the oscillator.

The method according to the invention results in various considerable advantages over the prior art. For example, the absolute value of the oscillator output signal is measured directly. There is no need for any reference signal for evaluation and generation of a correction for nonlinearities. Direct digital frequency detection means that there is no need to compensate for influencing variables such as temperature drift, aging, etc. Furthermore, the method according to the invention—as will be explained in more detail with reference to exemplary embodiments—can be implemented with a reasonably small number of required components in comparison to the methods according to the prior art described initially. Finally, the bandwidth of the control loop can be set within wide limits and can be optimized for the particular oscillator by setting a specific gate time for the counting device. Finally, the use of a microcontroller allows a functional check of the voltage controlled oscillator to be carried out easily, while allowing high flexibility in the linearization.

Other embodiments relate to a method for detection and correction of nonlinearities in radio-frequency voltage controlled oscillators, in which the nonlinearities are not corrected by appropriate adaptation of the actuation voltage for the oscillator, but by appropriate adaptation of the time at which the radar received signals are sampled. This procedure can be referred to as "frequency-wise-constant signal sampling", which will be explained in more detail in the course of the following description of the exemplary embodiments.

Figure 1:
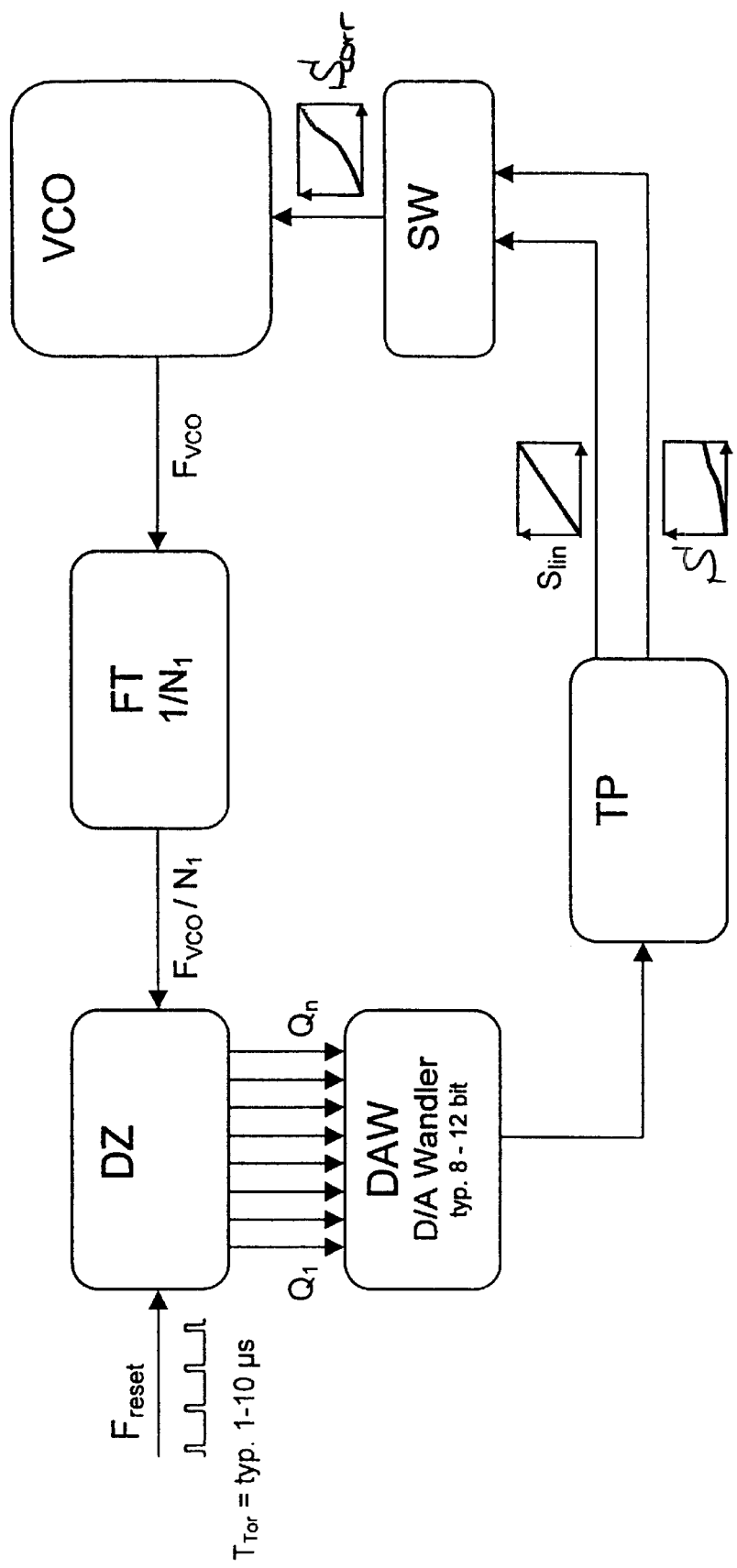
FIG. 1 shows a block diagram of a first embodiment of an apparatus for detection and correction of nonlinearities in an oscillator.

In FIG. 1 VCO denotes a voltage controlled microwave oscillator, which transmits an output signal $F_{VCO}$. This is typically in the GHz band, for example around 24 GHz. In the FMCW method, the output signal is modulated by the oscillator VCO, that is to say it is varied with a sawtooth waveform about the carrier frequency, typically with a total rise and fall time of 5 ms and a maximum frequency shift of 1 GHz.

The oscillator VCO is followed by a frequency divider FT, which divides the output signal $F_{VCO}$ of the oscillator VCO by an initial division factor $1/N_1$ to a target frequency band of, typically, 100 MHz. This target frequency band $F_{VCO}/N_1$ lies in a frequency band which can be processed without any problems by standard logic modules.

The frequency divider FT is followed by a digital counter DZ which directly analyzes the divided output signal $F_{VCO}/N1$. The counter is operated with a reset frequency $F_{reset}$ so as to produce a gate time $T_{Gate}=1/F_{reset}$ of, typically, 1 μs to 20 ms. The gate time is selected in advance such that the digital counter DZ reaches a maximum counter value at the maximum frequency $F_{VCO}$ of the oscillator output signal and for a given initial division factor $1/_1$. The counts which are output via the outputs $Q_1$ to $Q_N$ and which represent the signal waveform of the output signal $F_{VCO}$ of the oscillator VCO are passed to the digital/analogue converter DAC, which can typically process 8 to 12 bits in parallel. This results in the production of an equivalent-voltage value which corresponds to the digitally detected output signal $F_{VCO}$ and is obtained from the described conversion of the respective counter values in the counter DZ.

The equivalent-voltage values are passed to a control loop which is formed by the low-pass filter TP and the nominal value comparator SW. In this control loop, the control signal $S_{corr}$ with a corrected frequency response is produced for the oscillator VCO by comparing a linear ramp $S_{lin}$ with the equivalent-voltage value S from the D/A converter DAC, converted to analogue form and preprocessed by means of the low-pass filter TP. Since the control signal $S_{corr}$ has a non linear profile, the output signal $F_{VCO}$ of the oscillator VCO is linear-modulated.

Figure 2:
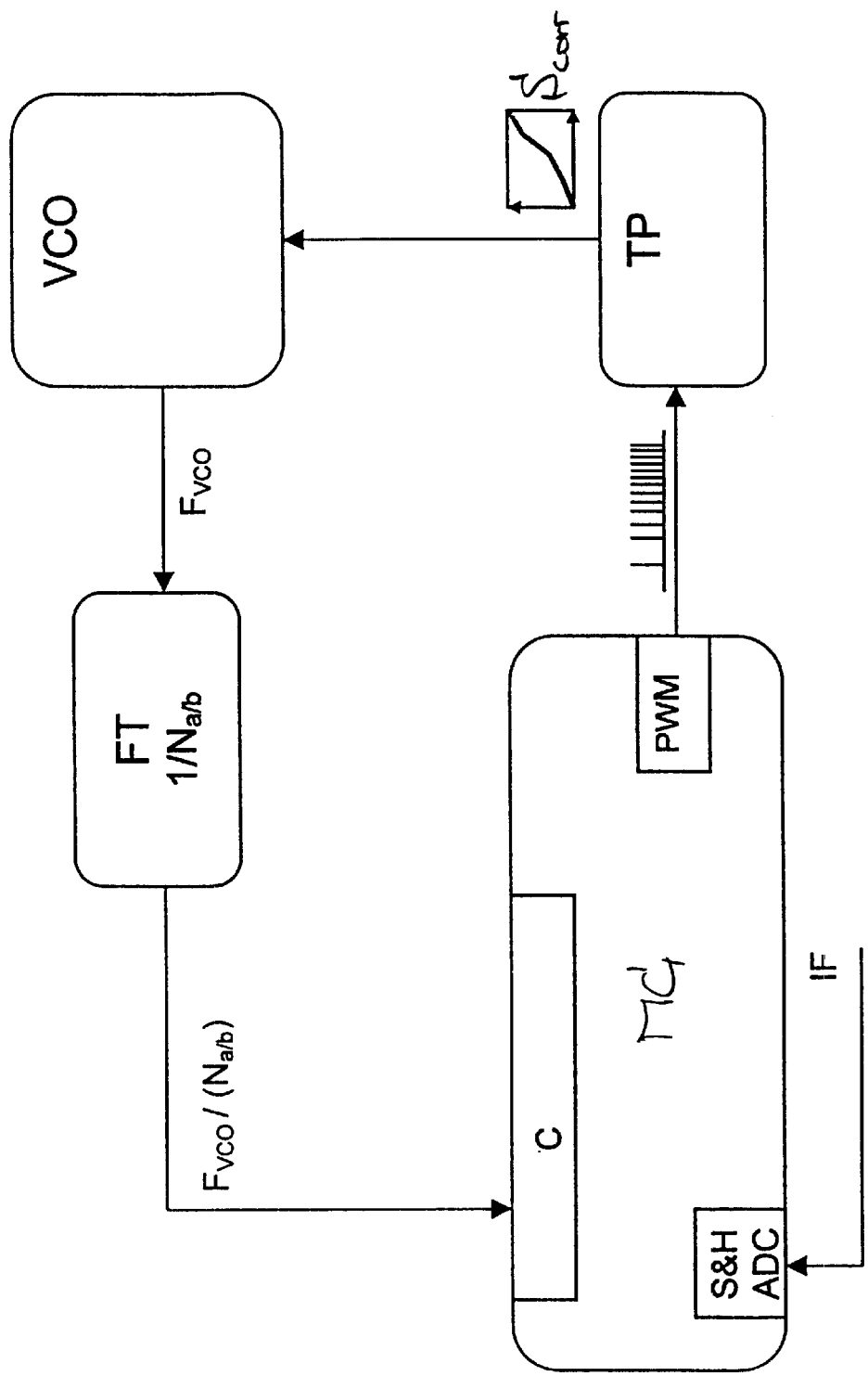
FIG. 2 shows a block diagram of a second embodiment of the present invention.

The implementation of the method according to the invention illustrated in FIG. 2 uses a microcontroller MC which combines various functions relating to the method according to the invention. For example, it is provided with a counter C whose input is connected to the frequency divider FT. The frequency divider FT reduces the output signal $F_{VCO}$ of the oscillator VCO, which is in the GHz band, by the initial division factor $1/N_{a/b}$ to the values which can be processed by the microcontroller MC. This signal $F_{VCO}/N_{a/b}$ is detected via the counter. Two different frequency measurement methods can be used in this case, as illustrated schematically in FIGS. 3 and 4.

Figure 3:
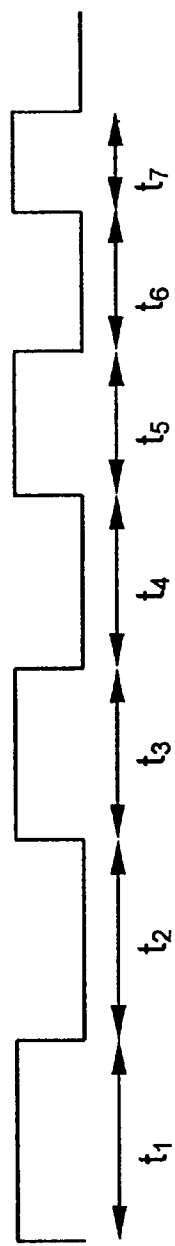
FIG. 3 shows a schematic diagram to illustrate frequency measurement variants for the analysis for the output signal.

For example, in the alternative illustrated in FIG. 3, the divided signal $F_{VCO}/N_a$ is analyzed by successive detection of the period duration $t_1, t_2, \ldots t_7$ of the frequency flanks of the divided signal $F_{VCO}/N_a$.

Figure 4:
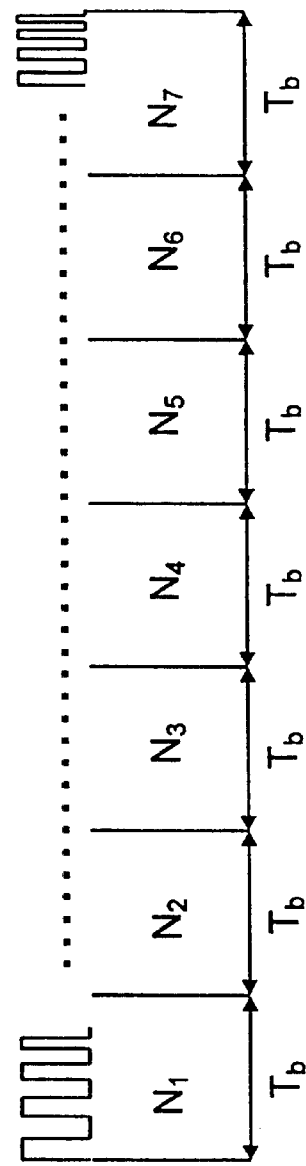
FIG. 4 shows a schematic diagrams to illustrate frequency measurement variants for the analysis for the output signal.

In the alternative illustrated in FIG. 4, the analysis is carried out by counting the flanks of the divided signal $F_{VCO}/N_b$ during a predetermined gate time $T_b$. For example, there are thus N1, $N_2 \ldots N_7$ flanks in the individual gate time intervals.

The analysis methods illustrated in FIGS. 3 and 4 are used either on their own or in combination depending on the peripheral hardware being used and the desired requirements relating to the maximum permissible linearity tolerances.

The microcontroller MC now uses the measured values detected by the counter C to determine the linearization voltage itself using predetermined software, and uses the pulse width modulation output PWM, which microcontrollers generally have, to output an appropriate control signal for the oscillator VCO. This output passes the signal generated by the microcontroller MC to the low-pass filter TP, which in turn actuates the input of the voltage controlled oscillator VCO.

In summary, the linearization of the oscillator VCO is carried out as follows:

the microcontroller outputs a linear control voltage via the pulse width modulation output PWM, and this is used to actuate the oscillator VCO.

The divided frequency $F_{VCO}/N_{a/b}$ is determined by the counter C with the aid of the variants illustrated in FIGS. 3 and 4.

The microcontroller uses the measured values to determine the frequency error from an optimum linear frequency variation, and defines corresponding correction values for the pulse width modulation output PWM.

A control voltage S with a corrected frequency response for the oscillator VCO is output via the pulse width modulation output.

The above method is repeated cyclically in order to provide continuous monitoring, with the control voltage $S_{corr}$ with the corrected frequency response for the oscillator VCO being corrected as required, and being output via the pulse width modulation output PWM.

This continuous monitoring and direct measurement of the oscillated frequency $F_{VCO}$ as an absolute value allows the correct operation of the linearization unit and any drift away from that predetermined frequency band to be detected and prevented in a sensible manner.

However, the two frequency measurement variants, namely successive period duration measurement of the frequency flanks on the one hand and counting the frequency flanks during a given gate time on the other hand, mean that, owing to the use of a microcontroller, there is no direct path from the frequency measurement side to the output side for the actuation voltage S, as is shown in FIG. 2. This is a closed control loop with a corresponding control bandwidth. However, the two frequency measurement variants can be used without any reservations and without any adverse effects on performance in voltage controlled oscillators VCO with little phase noise and for short object distances within the correlation length of the FMCW radar.

Figure 5:
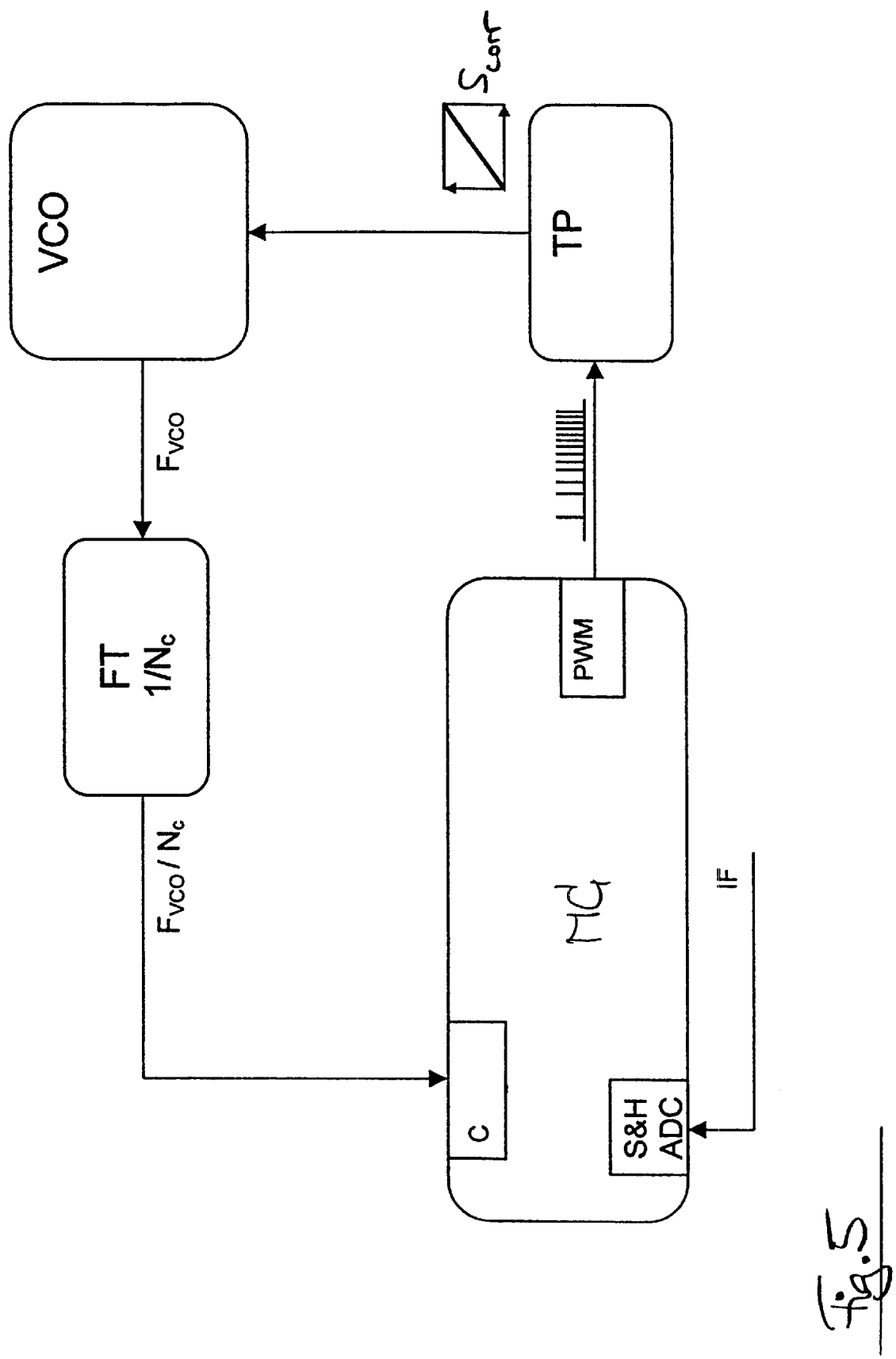
FIG. 5 shows a block diagram of a third embodiment of an evaluation circuit.
Figure 6:
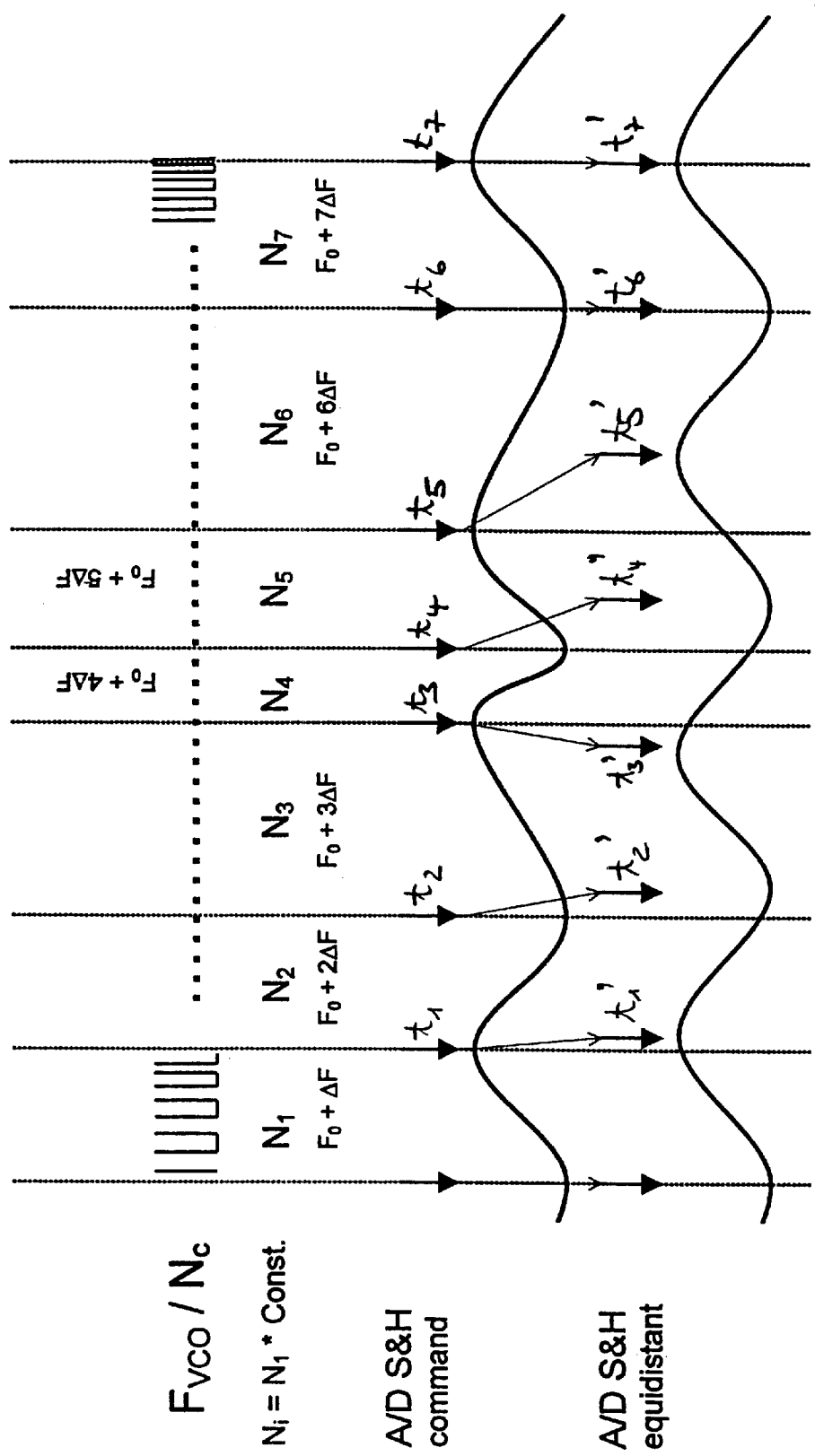
FIG. 6 shows a schematic diagram to illustrate frequency-rise-constant signal sampling.

The abovementioned problem of the lack of a direct path is overcome by a modification of the direct frequency response correction by means of a microcontroller on which the invention is based, and this is shown in FIGS. 5 and 6. In this case, the output signal $F_{VCO}$ of the voltage controlled oscillator VCO is once again divided by the initial division factor $1/N_c$, by the frequency divider FT. The corresponding output signal $F_{VCO}/N_c$ is once again passed to the counter C in the microcontroller MC. This outputs a linear actuation voltage S for the oscillator VCO via the pulse width modulation output PWM, and this voltage is passed via the low-pass filter TP to the oscillator VCO. This does not take account of nonlinearities in the output signal $F_{VCO}$.

In fact, the nonlinearities are analyzed and corrected at the received signal detection and processing end in the radar unit. Accordingly, as can be seen in FIG. 6, the registers in the counter C are preloaded with the counts N1, N2 ... N7, which correspond to a linear frequency rise. They thus satisfy the relationship $$N_c = F_0 + i \cdot \Delta F$$

where i=0, 1, 2 ...

The divided signal $F_{VCO}/N_c$ is counted down in the individual registers and the received signal IF is analogue/ digital converted once one register has counted down, that is to say when it is reached a count=0. The occurrence of this event, that is to say at the times $t_1, t_2, t_3 \ldots$ in FIG. 6—results in the microcontroller MC starting to receive the signal from the analogue/digital converter ADC, to which the received signal IF is supplied. In the process, for example, the sample-and-hold element S&H can be triggered. The sampled A/D converter values obtained in this way are normally used to carry out signal processing algorithms, such as fast frequency transformation (Fast Fourier Transformation). If the output signal $F_{VCO}$ of the oscillator has a strict linear frequency profile, the method explained above necessarily results in equidistant signal recording points, namely, for example, the times $t_1', t_2', t_3' \ldots$ in FIG. 6. In the event of corresponding nonlinearities in the output signal $F_{VCO}$, the recording time is delayed by nonlinearities depending on the signal distortion. Since signal processing algorithms are normally based on equidistant sampling times, the described procedure results in an automatic delay in the recording times corresponding to the nonlinearities, which are corrected for in the process. This results in automatic signal distortion correction which, by virtue of the principle, has an absolute real time capability and does not require any control loop. In addition to this, suitable selection of the initial division factor Nc makes it possible to set the sampling rate $F_{A/D}$ required for signaling processing.

What is claimed is:

1. A method for detection and correction of nonlinearities in radio-frequency voltage controlled oscillators, comprising:

actuating the oscillators with a linear control voltage;

dividing an output signal of at least one of the oscillators by an initial division factor by a frequency divider to a target frequency band which is at least one order of magnitude lower than at least one of the oscillator output signals; and analyzing the divided output signal by a counting device with registers of the counting device being loaded with preset counts, which correspond to a linear frequency response of the output signal and with the registers being counted down successively on the basis of the analyzed, actual profile of the divided output signal and signal sampling from a received signal being carried out when the value 0 is reached in the register.

2. The method as claimed in claim 1, wherein the signal sampling from the received signal is initiated by triggering a sample-and-hold element in an analogue/digital converter by counting device.

* * * * *